US009648771B1

(12) United States Patent
Markowski et al.

(10) Patent No.: US 9,648,771 B1
(45) Date of Patent: May 9, 2017

(54) MULTI-PIECE RACK SHELF

(71) Applicant: Middle Atlantic Products, Inc., Fairfield, NJ (US)

(72) Inventors: Leszek Markowski, Riverdale, NJ (US); John Franetovich, Glenwood, NJ (US); Nico Corbo, Blairstown, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 0 days.

(21) Appl. No.: 15/086,995

(22) Filed: Mar. 31, 2016

(51) Int. Cl.
*H05K 7/14* (2006.01)

(52) U.S. Cl.
CPC ......... *H05K 7/1401* (2013.01); *H05K 7/1489* (2013.01); *H05K 7/1491* (2013.01)

(58) Field of Classification Search
CPC .. H05K 7/1401; H05K 7/1491; H05K 7/1489; H05K 7/18; H05K 7/1488; H05K 7/14; H05K 7/1485; H05K 7/20736; A47B 47/024; A47B 96/024
USPC .......... 211/26, 134, 153, 183; 248/235, 250, 248/243, 222.11; 312/223.1, 223.2
See application file for complete search history.

(56) References Cited

U.S. PATENT DOCUMENTS

| | | | | |
|---|---|---|---|---|
| 5,009,383 A * | 4/1991 | Chapman | ................ | E04B 9/006 248/27.1 |
| 5,969,937 A * | 10/1999 | Rose | ...................... | H02B 1/056 248/222.11 |
| 6,394,398 B1 * | 5/2002 | Reed | ..................... | H05K 7/1449 211/153 |
| 6,719,149 B2 * | 4/2004 | Tomino | ............... | G02B 6/4453 211/26 |
| 7,433,176 B2 * | 10/2008 | Kyle | ..................... | H05K 7/1487 29/521 |
| D586,583 S | 2/2009 | Schluter et al. | | |
| 7,866,488 B2 * | 1/2011 | Mimlitch, III | ....... | A47B 47/024 211/26 |
| 7,999,179 B2 * | 8/2011 | Eckberg | ............... | H05K 7/1491 174/17 VA |
| 8,254,108 B2 * | 8/2012 | Chang | .................. | H05K 7/1489 312/223.2 |
| D702,826 S | 4/2014 | Schluter et al. | | |
| 8,913,866 B2 * | 12/2014 | Cote | .................... | G02B 6/4453 361/600 |
| 2002/0181191 A1 * | 12/2002 | Huang | .................. | H05K 7/142 361/679.58 |

(Continued)

*Primary Examiner* — Daniel J Troy
*Assistant Examiner* — Hiwot Tefera
(74) *Attorney, Agent, or Firm* — Drinker Biddle & Reath LLP

(57) ABSTRACT

A multi-piece shelf for an electronics rack, the electronics rack having a base and at least two vertical posts. The multi-piece shelf includes at least two side brackets and a removable shelf, the side brackets being separate components from the shelf. Each side bracket includes a vertical wall and a shelf mounting flange that is integral to and extends laterally from the vertical wall. A post mounting flange is integrally attached to at least a portion of the vertical wall for attaching to a vertical post. The removable shelf includes a flat bottom portion with at least two shovel lances formed on and extending downward and rearward from a lower surface of the bottom portion. Each shovel lance having a locking section that is spaced apart from the bottom portion and configured to it into an aperture in the shelf mounting flange.

14 Claims, 6 Drawing Sheets

(56) References Cited

U.S. PATENT DOCUMENTS

| | | | |
|---|---|---|---|
| 2006/0118685 A1* | 6/2006 | Schluter | H05K 7/1448 248/244 |
| 2011/0043986 A1* | 2/2011 | Conn | H05K 7/1492 361/679.02 |
| 2011/0121696 A1* | 5/2011 | Zhou | H05K 7/1489 312/223.1 |

* cited by examiner

MULTI-PIECE RACK SHELF

FIELD OF THE INVENTION

The invention relates to electronics racks, such as those used for computer related electronic components, and more specifically to a versatile multi-piece shelf for supporting electronics equipment on a rack.

BACKGROUND

Rack assemblies are commonly used for supporting electronic components such as computer, audio, and video equipment. Such rack systems are typically of cabinet-like construction so as to allow for the vertical stacking of the equipment. Most of these rack systems provide access to both the front control panels and the rear input/output (I/O) interface panels of the stacked equipment. Often, such rack assemblies are used in commercial settings, such as data centers, where the arrangement of components on racks and rack shelfing are changed overtime to accommodate different products. Racks are typically designed with a common spacing in the width direction between vertical posts (for example, 19 or 23 inches) and, as such, most rack shelves are designed to accommodate those set widths.

Generally, a rack shelf is formed as a single piece of bent metal, such as steel or aluminum, with cutouts to accommodate mounting, lighten the shelf and permit air to pass. The shelf includes a planar base portion with two side walls extending up from the base. The side walls have flanges formed on a front edges that are used to attach the shelf to the vertical posts of the rack.

Although conventional shelves are suitable for standard component mounting, they do not provide versatility for the changing uses and products that are becoming more common in the electronics industry. Also, since the depths of the racks can vary, conventional shelves must be selected to match the particular rack.

SUMMARY OF THE INVENTION

According to one aspect of the present invention, there is provided a multi-piece shelf for an electronics rack, the electronics rack having a base and at least two vertical posts; the multi-piece shelf comprising at least two side brackets and a removable shelf, the side brackets being separate components from the shelf. Each side bracket having a vertical wall, and a shelf mounting flange, the shelf mounting flange being integrally attached to and extending laterally from the vertical wall. The vertical walls having a front edge and a rear edge. A post mounting flange is integrally attached to at least a portion of the vertical wall and extends laterally from the vertical wall in a lateral direction opposite from the direction that the shelf mounting flange extends from the vertical wall.

The removable shelf includes a substantially planar bottom portion, the bottom portion having a width that is less that the width between the two adjacent side brackets when the side brackets are attached to adjacent vertical posts. The shelf has a front edge with a return flange on at least a portion of the front edge, the return flange including a leg that is substantially parallel to and spaced apart from the planar bottom portion so as to form a gap sufficiently wide to capture a forward edge of the shelf mounting flange. The shelf has at least two shovel lances formed on the shelf, each shovel lance extending downward and rearward from a lower surface of the bottom portion. Each shovel lance has a locking section that is spaced apart from the bottom shelf portion.

Each shelf mounting flange includes at least one aperture sized to receive a shovel lance, and wherein when the shovel lance is located in the aperture rearward sliding of the shelf relative to the vertical wall, which causes the locking section of the shovel lance to slide under a portion of the shelf mounting flange and the leg of the return flange to slide under another portion of the shelf mounting flange, thereby removably securing the shelf to the side brackets.

The present invention also describes a multi-piece shelf for an electronics rack, the electronics rack having a base and at least two vertical posts; the multi-piece shelf comprising at least two side brackets and a removable shelf, the side brackets being separate components from the shelf. Each side bracket has a vertical wall and a shelf mounting flange, the shelf mounting flange being integrally attached to and extending laterally from the vertical wall at an approximately 90 degree angle. The vertical walls having a front edge and a rear edge. A post mounting flange is integrally attached to at least a portion of the vertical wall and extends laterally from the vertical wall in a lateral direction opposite from the direction that the shelf mounting flange extends from the vertical wall.

The removable shelf includes a substantially planar bottom portion, the bottom portion having a width that is less that the width between the two adjacent side brackets when the side brackets are attached to adjacent vertical posts. The shelf having a front edge with a return flange on at least a portion of the front edge, the return flange including a leg that is substantially parallel to and spaced apart from the planar bottom portion so as to form a gap sufficiently wide to capture a forward edge of the shelf mounting flange. The shelf having at least four shovel lances formed on the bottom portion of the shelf, two of the shovel lances on either side of the bottom portion, with each shovel lance extending downward and rearward from a lower surface of the bottom portion. Each shovel lance having a locking section that is spaced apart from the bottom shelf portion, wherein the spacing of the locking section of the shovel lance from a bottom surface of the shelf mounting flange is no greater than the thickness of the shelf mounting flange.

At least one support bar having a leg on either end adapted to be attached to the vertical wall provide a connection between adjacent vertical walls.

Each shelf mounting flange includes at least two apertures, each aperture sized to receive one of the shovel lances, and wherein when the shovel lance is located in the aperture rearward sliding of the shelf relative to the vertical wall, this causes the locking section of the shovel lance to slide under a portion of the shelf mounting flange and the leg of the return flange to slide under another portion of the shelf mounting flange, thereby removably securing the shelf to the side brackets.

BRIEF DESCRIPTION OF THE DRAWINGS

For the purpose of illustrating the invention, there are shown in the drawings embodiments that are presently preferred; it being understood, however, that this invention is not limited to the precise arrangements and constructions particularly shown.

BRIEF DESCRIPTION OF THE PREFERRED EMBODIMENTS

Figure 1:
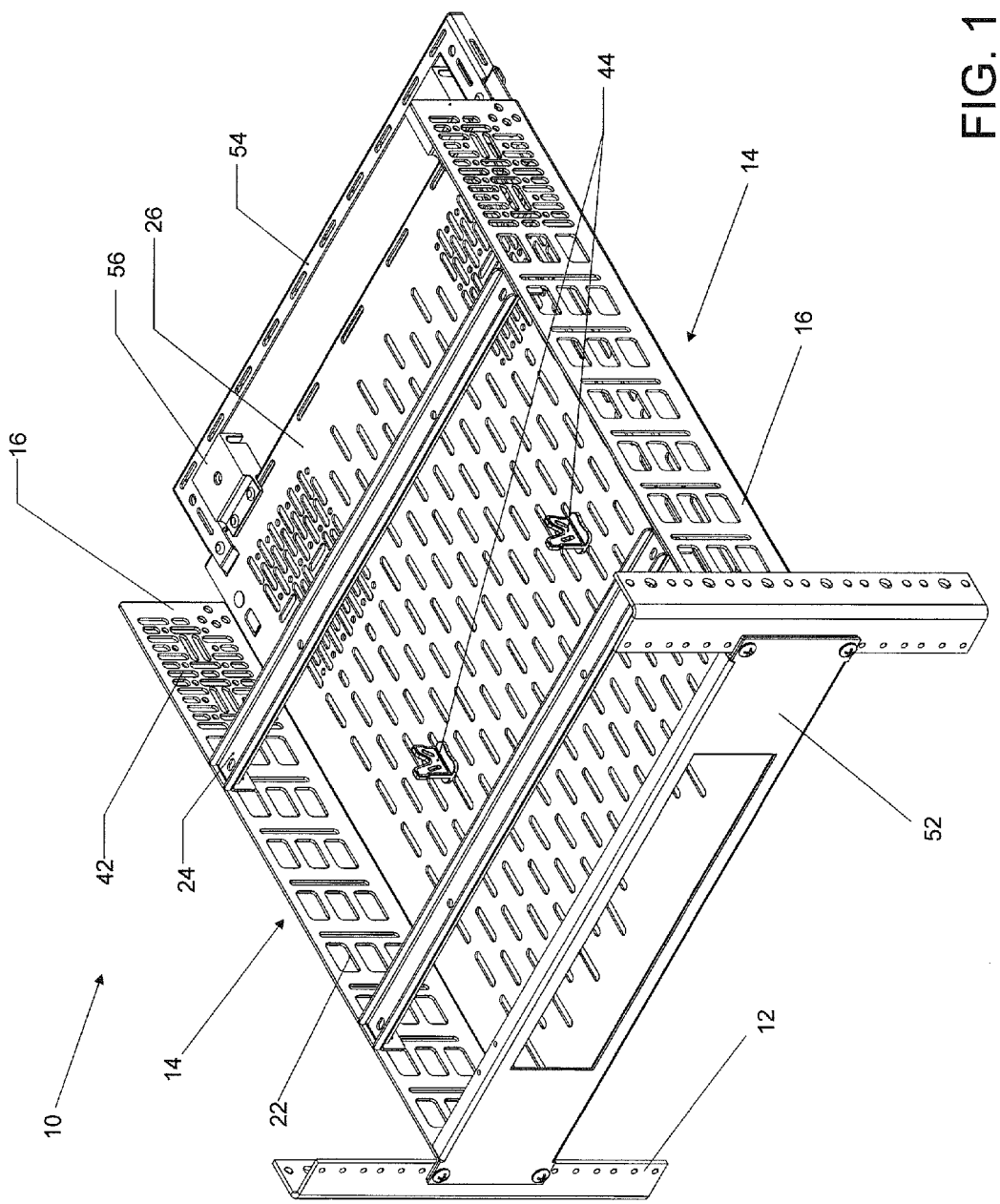
FIG. 1 is a perspective view of a multi-component shelf assembly according to an embodiment of the invention.

An embodiment of a multi-piece shelf assembly 10 is shown in FIG. 1 mounted to the front vertical posts 12 of a conventional rack. The rack includes a base frame (not shown), four vertical posts 12, and a top frame (not shown). The rack may include one or more cross-rails extending between the front and rear vertical posts 12 for the mounting of various equipment to be supported by the rack. The rack is conventional and, therefore, further details are not necessary.

Figure 2:
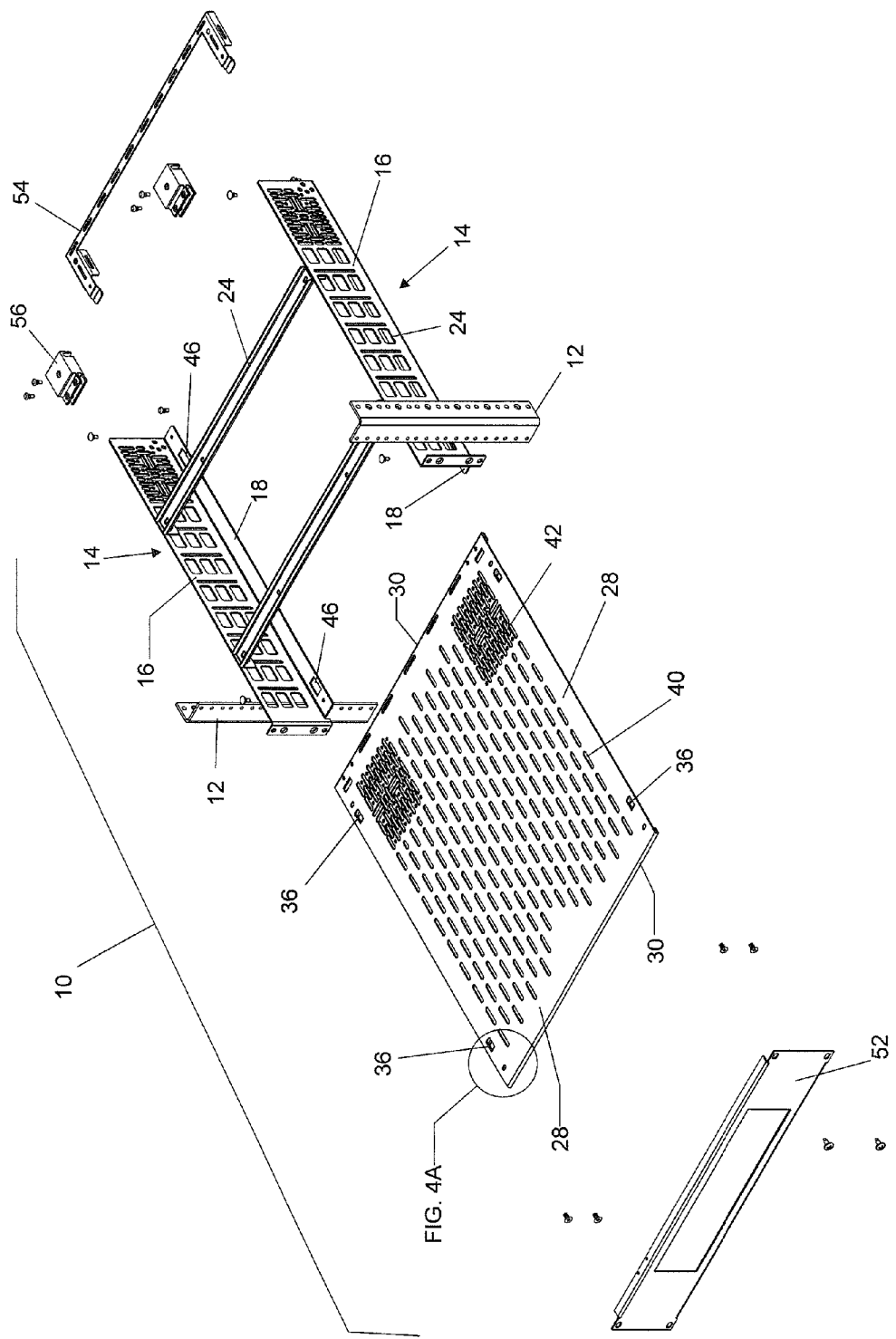
FIG. 2 is an exploded view of the shelf assembly of FIG. 1.
Figure 5:
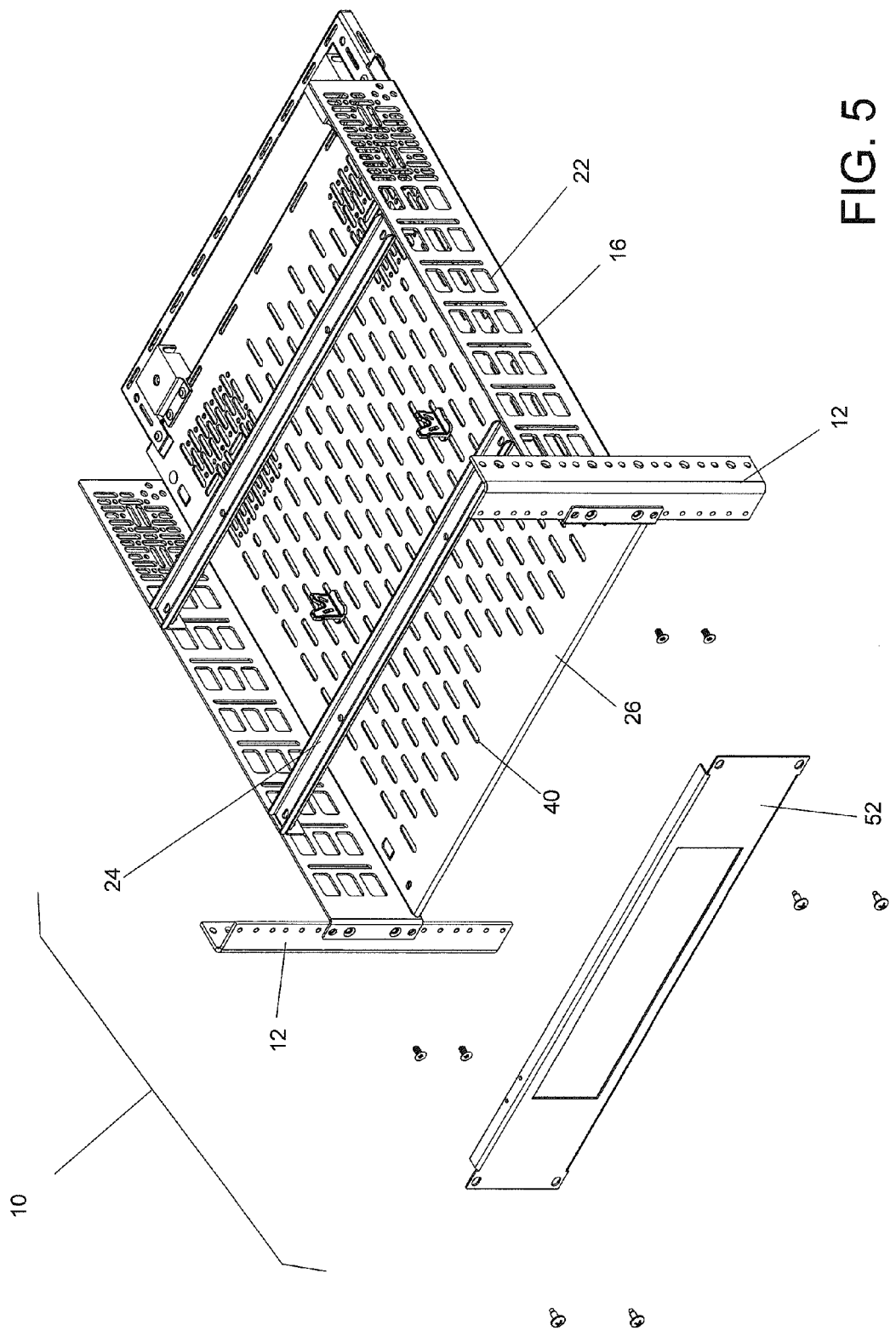
FIG. 5 is a perspective view of the shelf assembly of FIG. 1 with its face plate removed.
Figure 6:
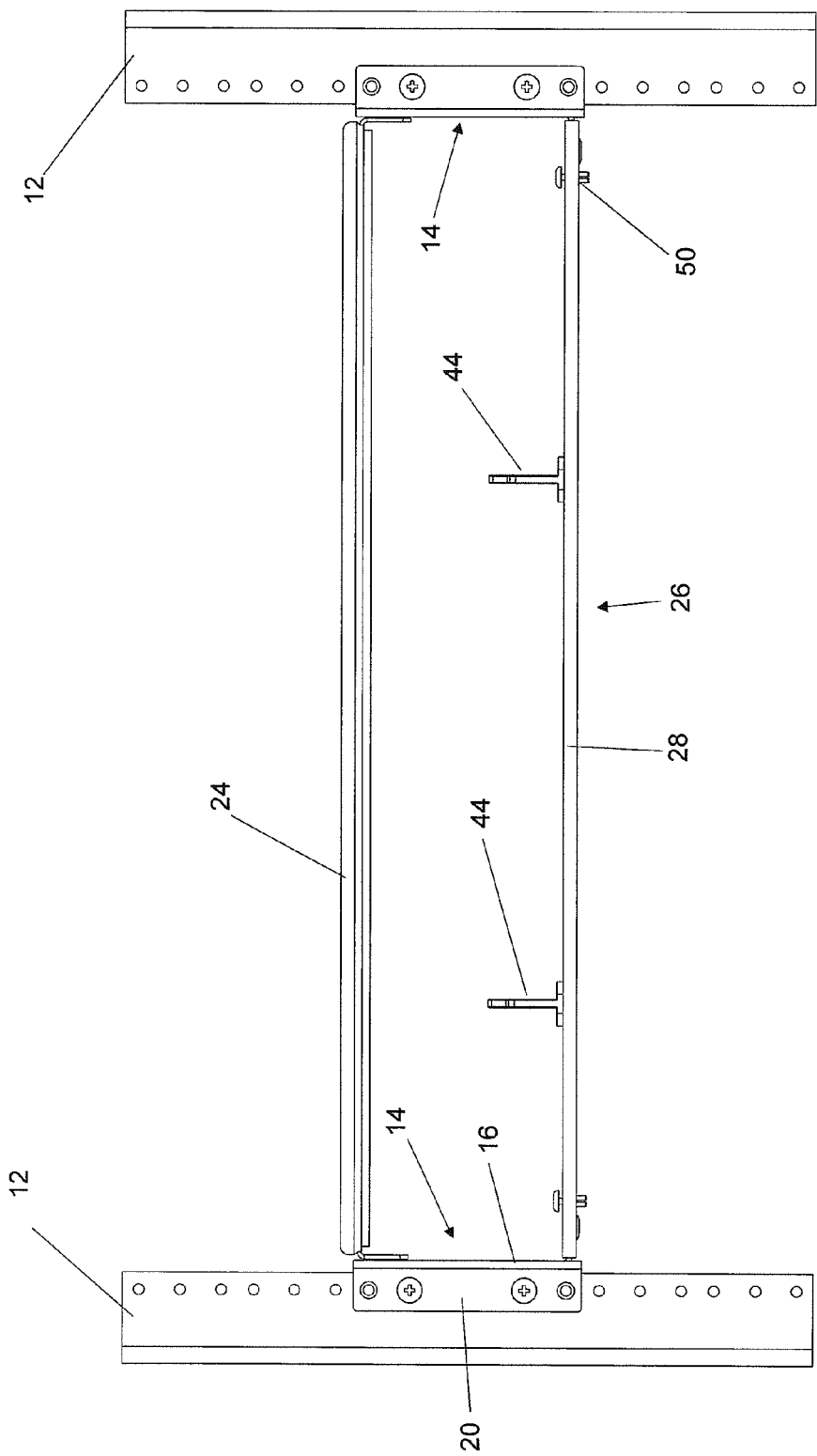
FIG. 6 is a front view of a portion of the rack illustrating the mounting of the shelf assembly to the vertical rack posts.

Referring to FIGS. 2, 5 and 6, the shelf assembly 10 includes two separate side brackets 14 that are preferably formed from metal, such as steel or aluminum. Each side bracket 14 includes a vertical wall 16, and a shelf mounting flange 18 integral to and extending laterally from the vertical wall, preferably at a 90 degree angle. At least one end of each side bracket 14 includes a post mounting flange 20 that is preferably integrally attached to at least a portion of the vertical wall 16. As shown in the illustrated embodiment, the post mounting flange 20 preferably extends at a right angle to the vertical wall 16 and in a lateral direction opposite from the direction that the shelf mounting flange 18 extends from the vertical wall 16. The vertical wall includes a plurality of cutouts or apertures 22, including holes, slots and obrounds, for mounting, clamping or securing components to the shelf, and for providing ventilation and lightening. Support bars 24 may be attached between the two side brackets 14 to provide additional stiffness if needed. In the illustrated embodiment, each support bar 24 includes a leg on either end that is attached to a mounting hole or slot 22 in the vertical wall 16, preferably with a screw.

Figure 3:
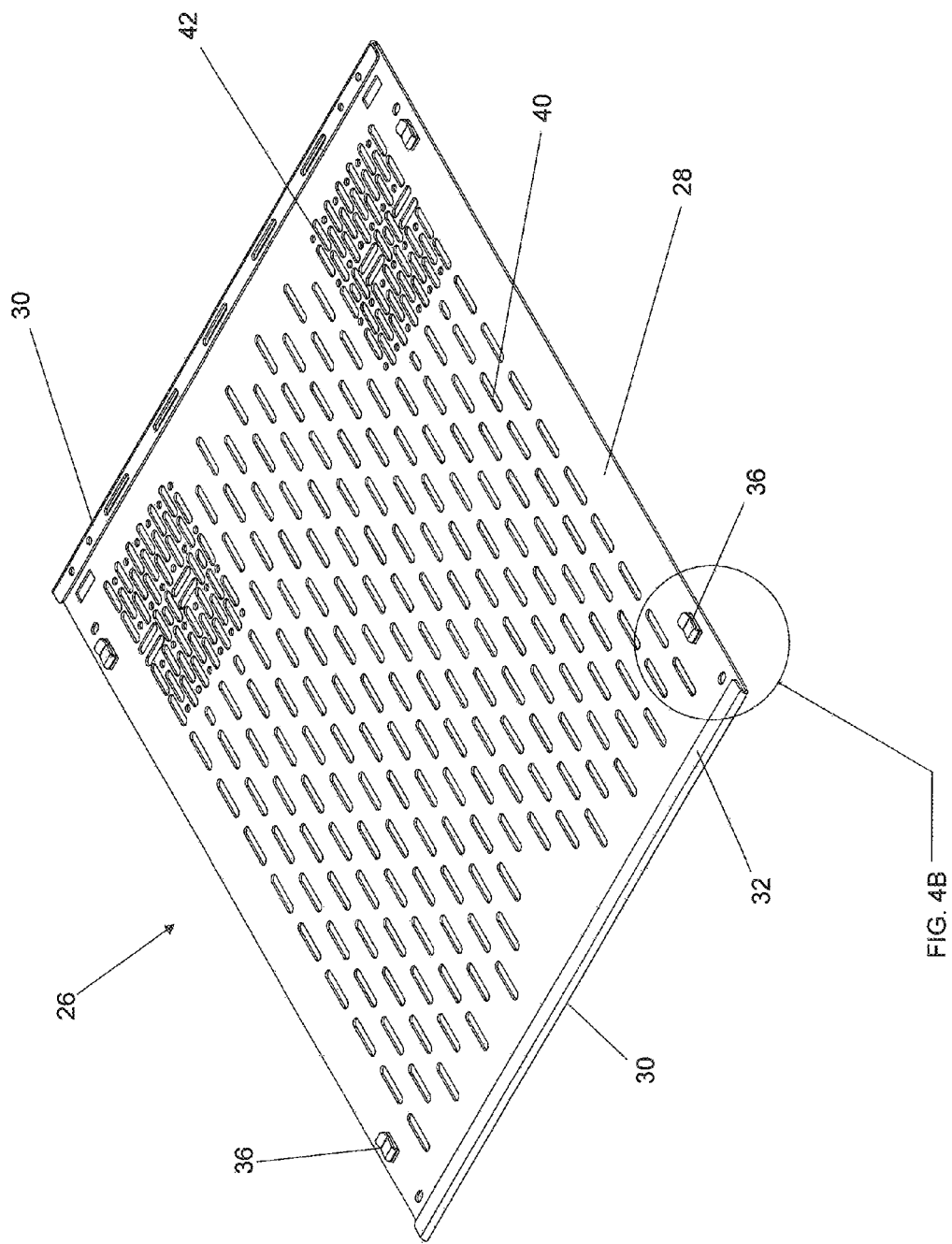
FIG. 3 is a bottom view of the shelf component of FIG. 1.

The shelf assembly 10 also includes a removable shelf 26 that is preferably formed from metal, such as steel or aluminum. The shelf 26 is shown in more detail in FIGS. 3 (upside down), 4A and 4B. The shelf 26 includes a planar bottom portion 28 that is preferably just slightly smaller than the width between the two side brackets 14 when the side brackets are attached to adjacent vertical posts. A return flange 30 is preferably formed along at least a portion of the front edge of the bottom portion 28. The return flange 28 includes a leg 32 that is substantially parallel to and spaced apart from the planar bottom portion 28 so as to form a gap sufficiently wide to capture a forward edge of the shelf mounting flange 18 as will be discussed below. The shelf 26 may include a second return flange 34 formed along a portion of the rear edge of the bottom portion 28. The return flanges 30, 34 function to stiffen the planar portion of the shelf.

Figure 4A:
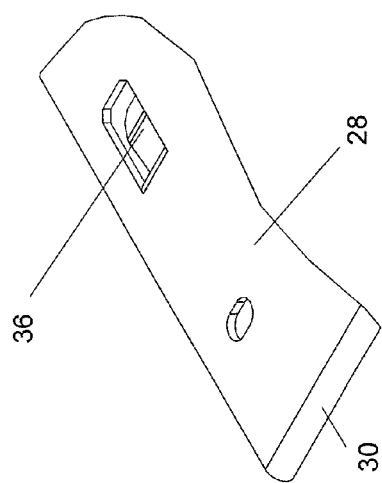
FIG. 4A is an enlarged portion of the shelf of FIG. 3.
Figure 4B:
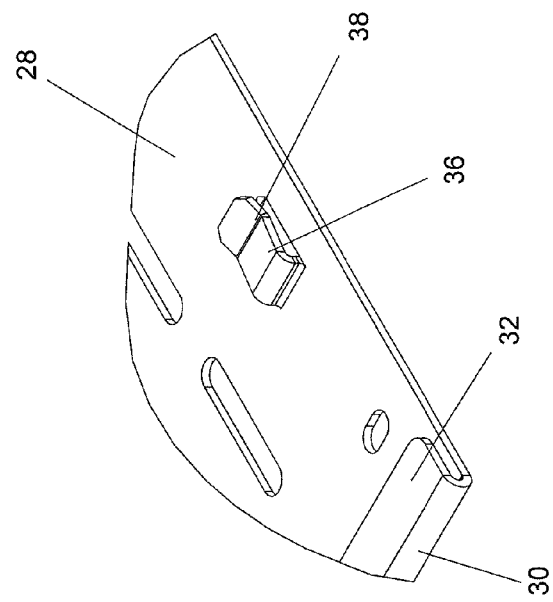
FIG. 4B is a bottom view of the enlarged portion of the shelf of FIG. 4A.

At least two, and more preferably at least four, mounting fingers or shovel lances 36 are formed in the shelf 26. Each shovel lance 36 extends downward and rearward from the lower surface of the bottom shelf portion 28. As shown in FIGS. 4A and 4B, the shovel lances 36 are preferably formed from a punched out section of the bottom shelf portion 28. The shovel lance 36 includes a locking section that is spaced apart from the bottom shelf portion 28 preferably by a distance that is at most the same as, and more preferably slightly less than, the thickness of the shelf mounting flange 18. The shovel lance 36 may include a jog or bent portion 38 to facilitate removable attachment of the shelf 26 to the shelf mounting flange 18. As with the vertical walls, the shelf 26 includes a plurality of cutouts or apertures 40, including holes, slots and obrounds, for mounting, clamping or securing components to the shelf, and for providing ventilation and lightening. Specific patterns of cutouts 42, such as those shown in U.S. Pat. D702,826, the disclosure of which is incorporated herein by reference in its entirety, may be included in portions of the shelf 26 and/or side brackets 14 to facilitate mounting of smaller components or for facilitating cable management. The cutouts 40 permit attachment of stop brackets to assist with locating and/or attaching components to the shelf 26.

More details on the shelf assembly will become apparent after discussion of its assembly. One side bracket 14 is attached to each front vertical post 12 by placing the post mounting flange 20 on a forward facing side of the vertical post and attaching it with suitable fasteners, such as screws or bolts. A second side bracket 14 is attached to the adjacent front vertical post in a similar manner. The support bars 24 can be attached if needed for additional stability. The shelf 26 is then positioned on top of the shelf mounting flanges 18 such that the shovel lances 36 line up with and are positioned inside shelf mounting slots 46 formed in the shelf mounting flanges 18 (FIG. 2). A slight rearward force is applied to the shelf causing the shovel lances 36 to lock on the shelf mounting flange and the leg 32 of the forward return flange 28 to capture the front edges of the shelf mounting flanges 18. The shelf 26 is now removably secured to the side brackets 14. For additional protection against inadvertent sliding of the shelf 26 relative to the side brackets 14, plastic rivets 50 may be inserted in holes that extend through the shelf 26 and the shelf mounting flanges 18 (see, FIG. 7). In an alternate arrangement for assembling the shelf assembly, each side bracket 14 can be first attached to the shelf 26 as discussed above. The assembly 10 could then be slid between the vertical posts 12 and the post mounting flanges 20 secured to each post.

Once the shelf 26 and side brackets 14 are attached, additional optional components can be attached. For example, referring to FIGS. 1, 2 and 5, various removable face plates 52, such as a DVD faceplate, if needed can be attached to the vertical posts over the post mounting flanges as shown in FIG. 1. Other components, such as a cable management bracket 54 or power strip supports 56 can be attached to suitable slots and/or holes in the shelf 26.

One of the benefits of the present invention is that it eliminates the need to have different shelve assemblies for each rack depth. Also, the shelf 26 itself need not have the same depth as the side brackets 14. Another benefit is the ability to reduce the size of the unassembled unit for shipping. That is, the shelf assembly can be shipped in a flat packaging, thus saving space. With more and more data centers being located in remote locations, shipping of racks and shelving units is very common.

A further benefit is that the invention permits the shelf 26 to be easily removed from and replaced on the side brackets 14 without tools. This allows for the shelf with its mounted components to be quickly removed. As such, inspecting and servicing the components is greatly facilitated.

While the invention has been disclosed with reference to certain preferred embodiments, numerous modifications, alterations, and changes to the described embodiments are possible without departing from the sphere and scope of the invention, as defined in the appended claims and equivalents thereof. Accordingly, it is intended that the invention not be limited to the described embodiments, but that it have the full scope defined by the language of the following claims.

The invention claimed is:

1. A multi-piece shelf for an electronics rack, the electronics rack having a base and at least two vertical posts; the multi-piece shelf comprising:
at least two side brackets and a removable shelf, the side brackets being separate components from the shelf,
each side bracket having a vertical wall, and a shelf mounting flange, the shelf mounting flange being integrally attached to and extending laterally from the vertical wall, the vertical walls having a front edge and a rear edge, a post mounting flange is integrally attached to at least a portion of the vertical wall and extends laterally from the vertical wall in a lateral direction opposite from the direction that the shelf mounting flange extends from the vertical wall;
the removable shelf includes a substantially planar bottom portion, the bottom portion having a width that is less that the width between the two adjacent side brackets when the side brackets are attached to adjacent vertical posts, the shelf having a front edge with a return flange on at least a portion of the front edge, the return flange including a leg that is substantially parallel to and spaced apart from the planar bottom portion so as to form a gap sufficiently wide to capture a forward edge of the shelf mounting flange, the shelf having at least two shovel lances formed on the shelf, each shovel lance extending downward and rearward from a lower surface of the bottom portion, each shovel lance having a locking section that is spaced apart from the bottom shelf portion; and
wherein each shelf mounting flange includes at least one aperture sized to receive a shovel lance, and wherein when the shovel lance is located in the aperture rearward sliding of the shelf relative to the vertical wall causes the locking section of the shovel lance to slide under a portion of the shelf mounting flange and the leg of the return flange to slide under another portion of the shelf mounting flange, thereby removably securing the shelf to the side brackets.

2. A multi-piece shelf according to claim 1, wherein the spacing of the locking section of the shovel lance from a bottom surface of the shelf mounting flange is no greater than the thickness of the shelf mounting flange.

3. A multi-piece shelf according to claim 1, wherein that are at least four shovel lances on the shelf, two on either side of the shelf, and at least two apertures formed in each shelf mounting flange at a location to receive the shovel lances.

4. A multi-piece shelf according to claim 3, wherein the shovel lances are formed from a punched out section of the bottom shelf portion.

5. A multi-piece shelf according to claim 4, wherein the locking section of the shovel lance includes a jog or bent portion.

6. A multi-piece shelf according to claim 4, wherein the shelf and side brackets are formed from metal.

7. A multi-piece shelf according to claim 4, wherein the shelf mounting flange extends from the vertical wall at an approximately 90 degree angle.

8. A multi-piece shelf according to claim 4, wherein the vertical wall of the side bracket and the shelf each includes a plurality of apertures for mounting, clamping or securing components to the shelf and for providing ventilation and lightening.

9. A multi-piece shelf according to claim 8, further comprising a plurality of stop brackets removably attached to the apertures in the shelf for locating and/or attaching components to the shelf.

10. A multi-piece shelf according to claim 8, further comprising at least one support bar having a leg on either end adapted to be attached to the vertical wall provide a connection between adjacent vertical walls.

11. A multi-piece shelf for an electronics rack, the electronics rack having a base and at least two vertical posts; the multi-piece shelf comprising:
at least two side brackets and a removable shelf, the side brackets being separate components from the shelf,
each side bracket having a vertical wall and a shelf mounting flange, the shelf mounting flange being integrally attached to and extending laterally from the vertical wall at an approximately 90 degree angle, the vertical walls having a front edge and a rear edge, a post mounting flange is integrally attached to at least a portion of the vertical wall and extends laterally from the vertical wall in a lateral direction opposite from the direction that the shelf mounting flange extends from the vertical wall;
the removable shelf includes a substantially planar bottom portion, the bottom portion having a width that is less that the width between the two adjacent side brackets when the side brackets are attached to adjacent vertical posts, the shelf having a front edge with a return flange on at least a portion of the front edge, the return flange including a leg that is substantially parallel to and spaced apart from the planar bottom portion so as to form a gap sufficiently wide to capture a forward edge of the shelf mounting flange, the shelf having at least four shovel lances formed on the bottom portion of the shelf, two of the shovel lances on either side of the bottom portion, each shovel lance extending downward and rearward from a lower surface of the bottom portion, each shovel lance having a locking section that is spaced apart from the bottom shelf portion, wherein the spacing of the locking section of the shovel lance from a bottom surface of the shelf mounting flange is no greater than the thickness of the shelf mounting flange;
at least one support bar having a leg on either end adapted to be attached to the vertical wall provide a connection between adjacent vertical walls; and
wherein each shelf mounting flange includes at least two apertures, each aperture sized to receive one of the shovel lances, and wherein when the shovel lance is located in the aperture rearward sliding of the shelf relative to the vertical wall causes the locking section of the shovel lance to slide under a portion of the shelf mounting flange and the leg of the return flange to slide under another portion of the shelf mounting flange, thereby removably securing the shelf to the side brackets.

12. A multi-piece shelf according to claim 11, wherein the shovel lances are formed from a punched out section of the bottom shelf portion, and wherein the locking section of the shovel lance includes a jog or bent portion.

13. A multi-piece shelf according to claim 12, wherein the shelf and side brackets are formed from metal, and wherein the vertical wall of the side bracket and the shelf each includes a plurality of apertures for mounting, clamping or securing components to the shelf and for providing ventilation and lightening.

14. A multi-piece shelf according to claim 13, further comprising a plurality of stop brackets removably attached to the apertures in the shelf for locating and/or attaching components to the shelf.

\* \* \* \* \*